United States Patent
Soda (10) Patent No.: US 6,577,167 B1
(45) Date of Patent: Jun. 10, 2003

(54) CLOCK SIGNAL PRODUCING CIRCUIT IMMEDIATELY PRODUCING CLOCK SIGNAL SYNCHRONIZED WITH INPUT SIGNAL

(75) Inventor: Masaaki Soda, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/699,245

(22) Filed: Oct. 27, 2000

(30) Foreign Application Priority Data

Nov. 5, 1999  (JP) .......................................... 11-315941

(51) Int. Cl.⁷ ............................................... H03K 5/00
(52) U.S. Cl. ............................. 327/91; 327/94; 327/95; 327/291; 327/293; 341/200
(58) Field of Search .............................. 327/91, 93, 94, 327/95, 291, 293, 294, 299, 141; 341/150, 157, 200; 377/70, 71, 72, 73

(56) References Cited

U.S. PATENT DOCUMENTS

| | | | |
|---|---|---|---|
| 4,672,639 A | * | 6/1987 | Tanabe et al. .............. 375/118 |
| 5,208,839 A | * | 5/1993 | Hladik et al. ................ 375/360 |
| 5,229,668 A | * | 7/1993 | Hughes, Jr. et al. .......... 327/91 |
| 5,294,844 A | * | 3/1994 | Motoike ....................... 327/91 |
| 5,315,627 A | * | 5/1994 | Draving ....................... 327/91 |
| 5,327,092 A | * | 7/1994 | Inogai et al. ................. 327/91 |
| 5,892,474 A | * | 4/1999 | Sugawara .................... 341/200 |
| 6,130,577 A | * | 10/2000 | Tamba et al. ................ 329/304 |

FOREIGN PATENT DOCUMENTS

| | | | | |
|---|---|---|---|---|
| JP | 8-154053 | 6/1996 | ........... | H03L/7/093 |
| JP | 8-321827 | 12/1996 | ........... | H04L/7/027 |
| JP | 9-149018 | 6/1997 | ........... | H04L/7/033 |
| JP | 11-168455 | 6/1999 | ........... | H04L/7/033 |

\* cited by examiner

*Primary Examiner*—Tuan T. Lam
*Assistant Examiner*—An T. Luu
(74) *Attorney, Agent, or Firm*—Hayes Soloway, P.C.

(57) ABSTRACT

A clock signal producing apparatus is composed of a detecting circuit and a clock signal outputting circuit. The detecting circuit detects edge timings of an input signal at which the input signal is inverted. The edge timings are quantized to a predetermined number of states. A clock signal outputting circuit outputs an outputted clock signal. A phase of the outputted clock signal is adjusted based on the edge timings.

16 Claims, 10 Drawing Sheets

CLOCK SIGNAL PRODUCING CIRCUIT IMMEDIATELY PRODUCING CLOCK SIGNAL SYNCHRONIZED WITH INPUT SIGNAL

BACKGROUND OF THE INVENTION

1. Field of the Invention

The present invention relates to clock signal producing circuit. More particularly, the present invention relates to a clock signal producing circuit immediately producing a clock signal synchronized with an input signal and also reproducing the input signal.

2. Description of the Related Art

A clock signal producing circuit, which produces a clock signal synchronizing with an input signal, is needed in a communication system.

Figure 1:
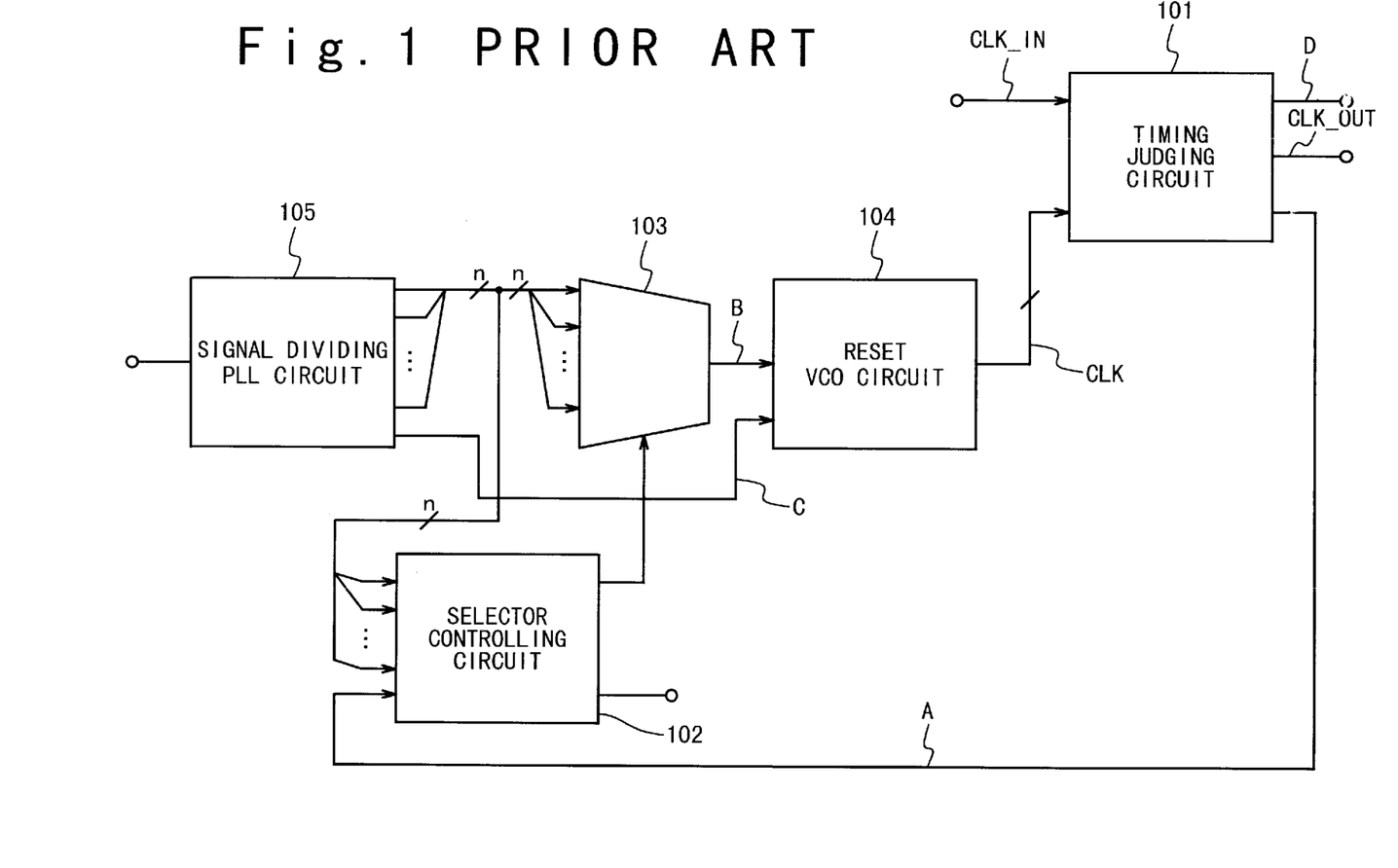
FIG. 1 is a view showing a configuration of a conventional clock signal producing circuit.

Such a clock signal producing circuit is known in Japanese Laid Open Patent Application (JP-A-Heisei, 9-149018). As shown in FIG. 1, the known clock signal producing circuit includes a timing judging circuit 101, a selector controlling circuit 102, a selector 103, a reset voltage control oscillator (hereafter, referred to as a reset VCO circuit) 104, and a multiplication PLL circuit (Phase Lock Loop circuit) 105.

The timing judgment circuit 101 judges whether a phase is advanced or delayed as compared with a clock signal, and outputs the judged result to the selector controller 102. The selector controller 102 feeds back a phase control signal through the selector 103 to the reset VCO circuit 104.

The reset VCO circuit 104 generates a clock signal having a phase corresponding to the phase control signal received through the selector 103 and a frequency corresponding to a frequency control signal from the multiplacation PLL circuit 105. The clock signal generated by the reset VCO circuit 104 is used in the data communication and the like.

The known clock identification reproduction circuit detects whether the phase is advanced or delayed, and performs a feedback control on the reset VCO circuit 104. However, a certain time is required until the reset VCO 104 on which the feedback control is performed is stabilized. Thus, a time is required until a synchronous establishment after an input of an input data. Also, it is difficult to estimate which number of bit the synchronization is surely established at.

Figure 2:
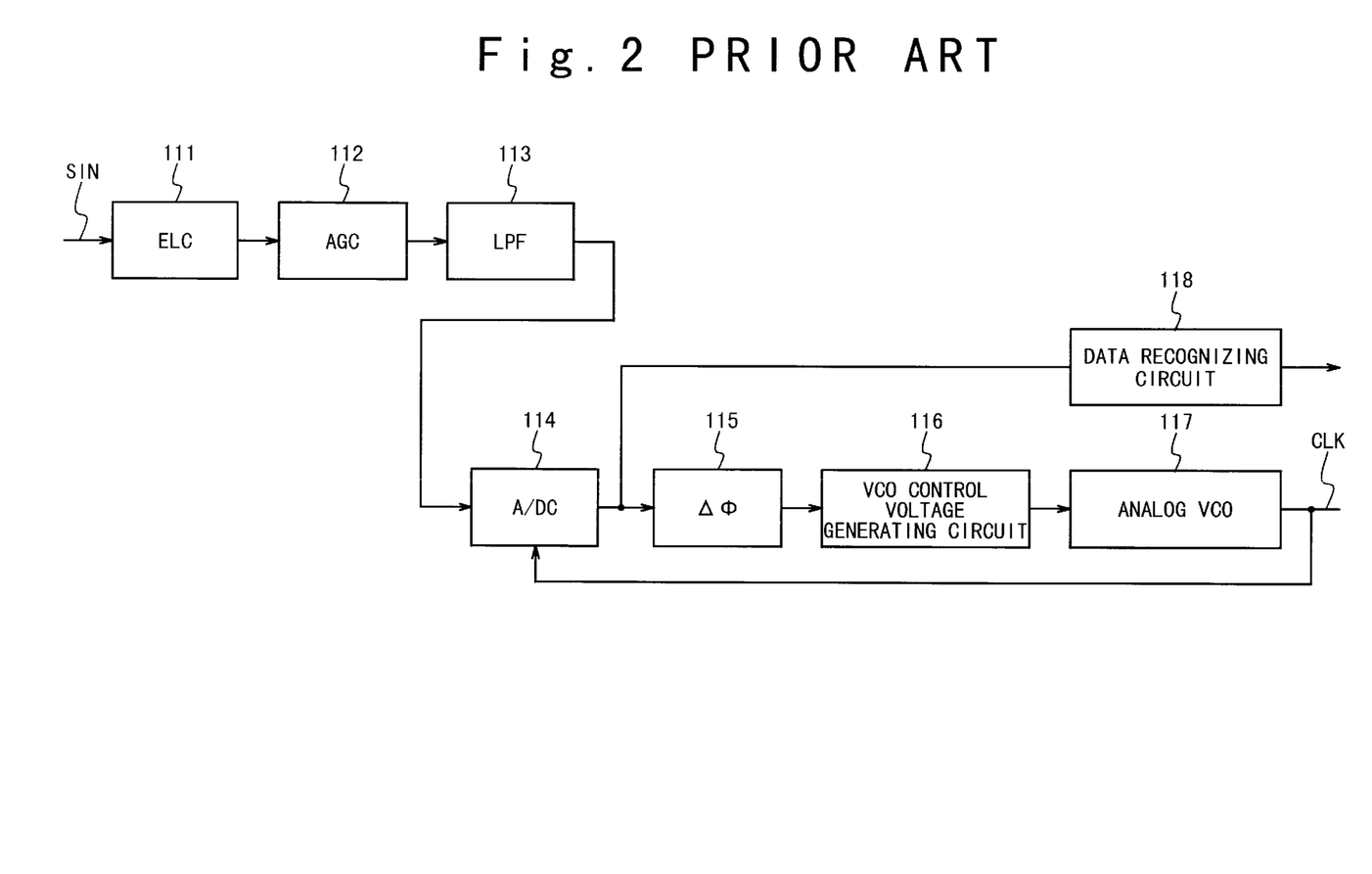
FIG. 2 is a view showing a configuration of a conventional clock signal producing circuit.

Also, another clock signal producing circuit is disclosed in Japanese Laid Open Patent Application (JP-A-Heisei, 8-154053). As shown in FIG. 2, the known clock signal reproduction circuit includes an equalizer (ECL) 111, an automatic gain controller (AGC) 112, a low pass filter 113, an analog-digital converter (ADC) 114, a digital phase difference detector 115, a VCO control voltage generator 116 and an analog VCO 117.

An analog RF signal SIN is sampled by the ADC 114. The digital phase difference detector 115 detects a difference between a phase of the analog RF signal and that of a clock signal CLK produced by the analog VCO 117. The VCO control voltage generator 116 generates a control voltage based on the difference. The analog VCO 117 generates the above-mentioned clock signal CLK, which is synchronized with the analog RF signal SIN, in accordance with the control voltage. The clock signal CLK is used as a sampling signal of the ADC 114. The clock signal CLK has a frequency satisfying the Sampling Theorem with respect to sampling the analog RF signal RIN. The ADC 114, the digital phase difference detector 115, the VCO control voltage generator 116 and the analog VCO 117 constitute a hybrid PLL 120.

In the other clock signal reproducing circuit, the feedback control is performed on the analog VCO 117, similarly to the above-mentioned clock signal producing circuit. Similarly, a certain time is required until clock signal CLK is stabilized.

Figure 3:
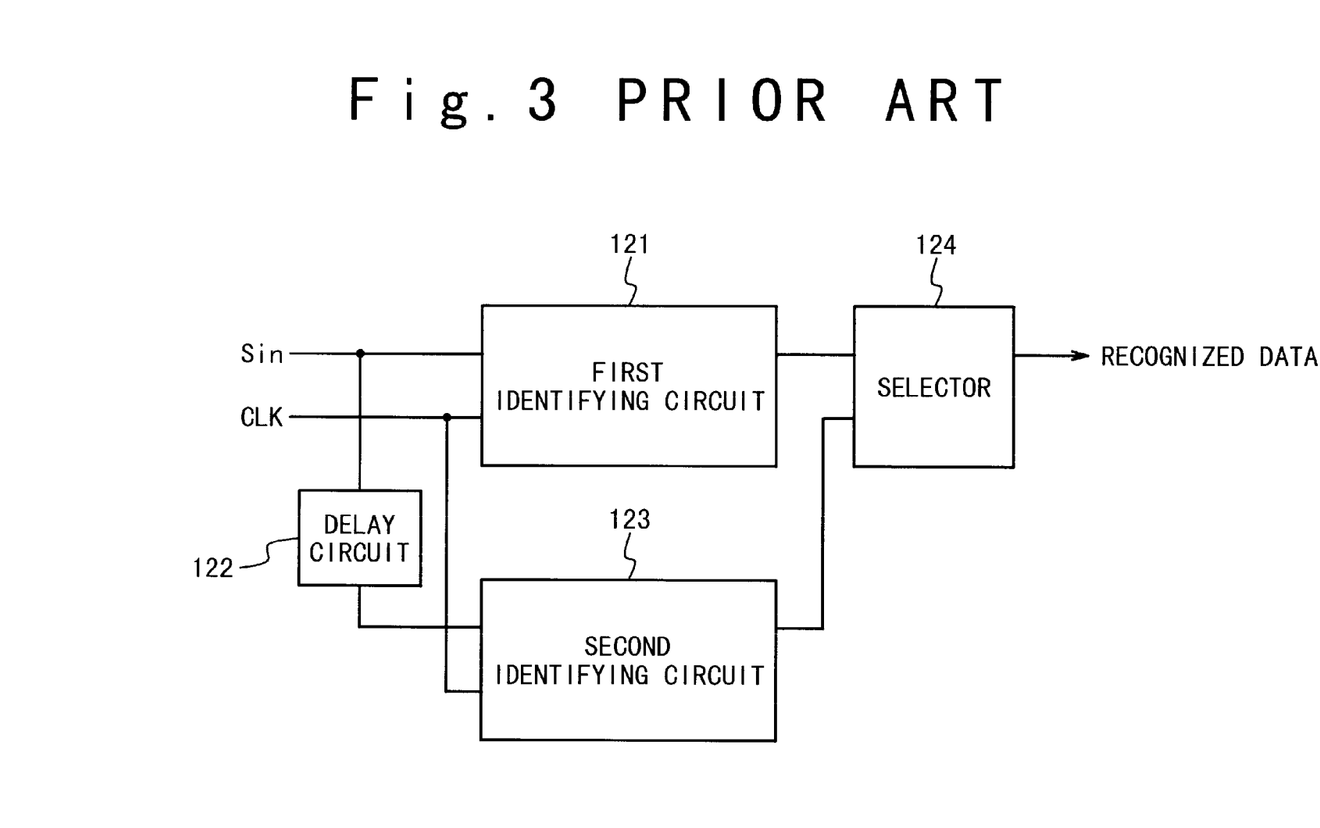
FIG. 3 is a view showing a configuration of conventional data identifying apparatus.

Still another data identification apparatus is disclosed in Japanese Laid Open Patent Application (JP-A-Heisei, 8-321827). As shown in FIG. 3, the known data identification apparatus includes a first identifying circuit 121, a delay 16, circuit 122, a second identifying circuit 123 and a selector 124.

An input signal $S_{in}$. is inputted to the first identifying circuit 121. The first identifying circuit 121 identifies data of the input signal $S_{in}$, and further judges a phase relation between the input signal $S_{in}$ and a clock signal CLK.

The input signal $S_{in}$ is further inputted to the delay circuit 122. The input signal $S_{in}$ is delayed by a certain time. The delayed input signal $S_{in}$ is inputted to the second identifying circuit 123. The second identifying circuit 123 identifies data of the delayed input signal $S_{in}$, and further judges a phase relation between the delayed input signal $S_{in}$ and the clock. The selector 124, in accordance with any of the judged result of the first identifying circuit 121 and that of the second identifying circuit 123, selects and outputs any of the identified data from the first identifying circuit 121 and that from the second identifying circuit 123.

It is desirable that the clock signal producing circuit establishes the synchronization with an input signal in a short time after the input signal is inputted. Also, it is desirable that the synchronization is surely established before an input of a certain number of data bits in the input signal is completed.

SUMMARY OF THE INVENTION

Therefore, an object of the present invention is to provide a clock signal producing circuit producing a clock signal synchronized with an input signal, which can establish the synchronization in a short time after an input of an input signal.

Another object of the present invention is to provide a clock signal producing circuit producing a clock signal synchronized with an input signal, which surely establishes the synchronization within a predetermined number of leading bits included in the input signal after an input of an input signal.

Still another object of the present invention is to provide a clock signal producing circuit producing a clock signal synchronized with an input signal without being influenced by jitters and noises in an input signal.

Still another object of the present invention is to provide a clock signal producing circuit producing a clock signal suitable for sampling an input signal.

Still another object of the present invention is to provide a signal reproducing circuit reproducing an input signal without using a clock signal having a high frequency.

In order to achieve an aspect of the present invention, a clock signal producing apparatus is composed of a detecting circuit and a clock signal outputting circuit. The detecting circuit detects edge timings of an input signal at which the input signal is inverted. The edge timings are quantized to a predetermined number of states. The clock signal outputting circuit outputs an outputted clock signal. A phase of the outputted clock signal is adjusted based on the edge timings.

In this case, the clock signal outputting circuit may select the outputted clock signal based on the edge timings from among a plurality of clock signals whose phases are different from each other.

The clock signal producing apparatus may be further composed of a memorizing circuit. In this case, the edge timings include a present edge timing which is the latest of the edge timings, and a past edge timing which is detected before the present edge timing is detected. The memorizing circuit memorizes the past edge timing. The phase of the outputted clock signal is adjusted based on the present edge timing and the past edge timing.

In this case, the phase is desirably adjusted based on the present edge timing during a first period, and the phase is desirably adjusted based on the present edge timing and the past edge timing during a second period following the first period.

Also, the clock signal outputting circuit is desired to select the outputted clock signal based on the present edge timing and the past edge timing from among a plurality of clock signals whose phases are different from each other.

Also, the edge timings desirably includes a rising edge timing at which the input signal rises from a low level to a high level, and a falling edge timing at which an input signal falls from the high level to the low level. In this case, the phase of the outputted clock signal is desirably adjusted based on the rising edge timing and the falling edge timing.

In this case, the phase is desirably adjusted such that another rising edge timing of the outputted clock signal is located in substantially a middle between the rising edge timing and the falling edge timing.

Also, the clock signal outputting circuit is desired to select the outputted clock signal based on the rising edge timing and the falling edge timing from among a plurality of clock signals whose phases are different from each other.

The clock signal producing apparatus may be further composed of a duty detecting circuit detecting a duty ratio of the input signal. In this case, the phase is desirably adjusted based on the duty ratio.

The clock signal producing apparatus may be further composed of a signal reproducing circuit sampling the input signal in synchronization with the outputted clock signal to reproduce a reproduced signal.

In order to achieve another aspect of the present invention, a method of producing a clock signal may be composed of:

inputting an input signal;

detecting edge timings of the input signal at which the input signal is inverted;

outputting an outputted clock signal, wherein a phase of the outputted clock signal is adjusted based on the edge timings. The edge timings are quantized to a predetermined number of states.

BRIEF DESCRIPTION OF THE DRAWINGS

FIG. 5 is a view showing a content of an input signal a;

DESCRIPTION OF THE PREFERRED EMBODIMENTS

A clock signal producing circuit of the present invention will be described below in detail with reference to the accompanying drawings.

Figure 4:
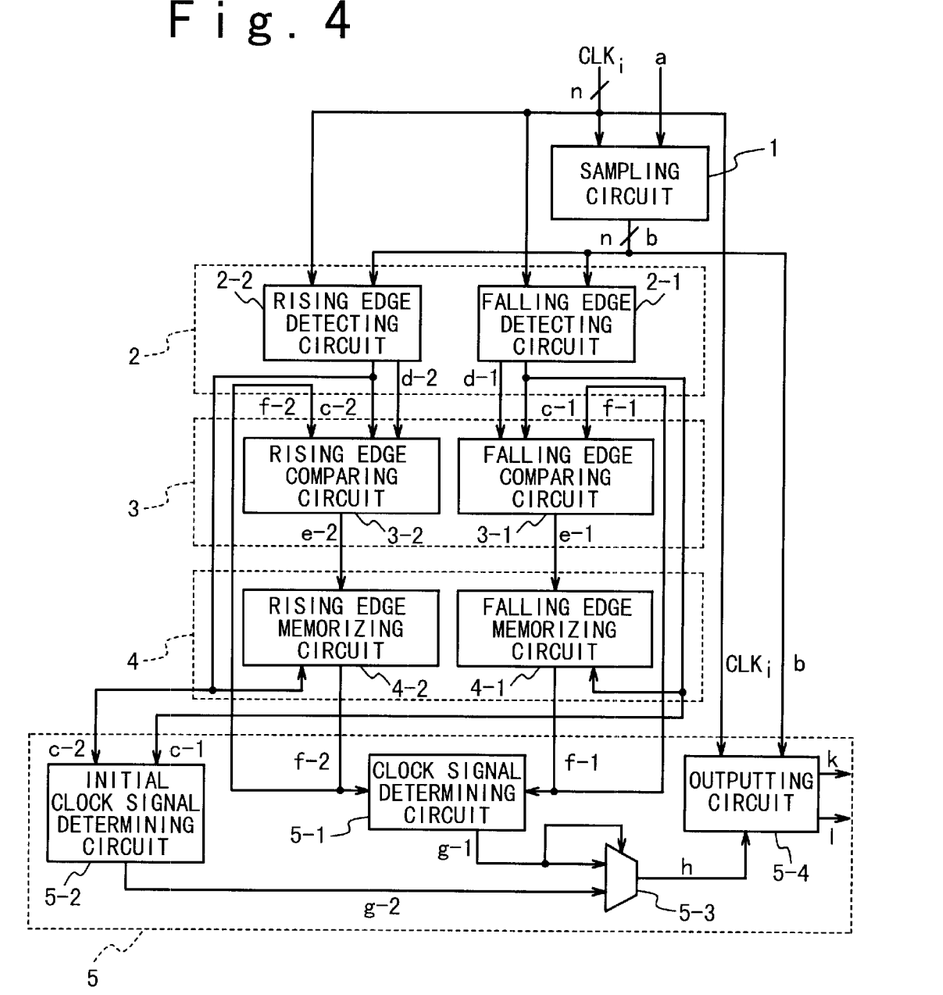
FIG. 4 is a view showing a configuration of a clock signal producing circuit according to a first embodiment of the present invention.

As shown in FIG. 4, a sampling circuit is provided with a detector. The sampling circuit 1 receives an input signal a and n clock signals $CLK_i$ (i is an integer from 0 to n−1).

Figure 5:
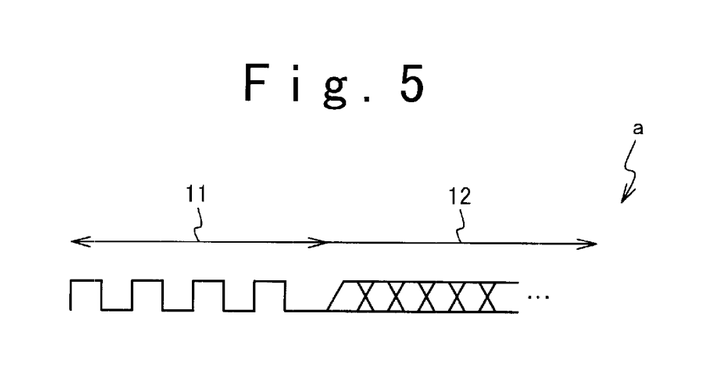

The input signal a has a preamble section 11 and a data section 12, as shown in FIG. 5. The preamble section 11 is firstly inputted at a time of an input of the input signal a. The data section 12 is inputted in succession.

The preamble section 11 is constituted by a repetition of "1" and "0" for each predetermined time. Here, the "1" is corresponding to a "high" level. The "0" is corresponding to a "low" level. The preamble section 11 is used to synchronize a clock signal produced by the clock signal producing circuit with the input signal a. A detection of a phase of the preamble section 11 determines a clock signal optimal for an operation for sampling the input signal a. The data section 12 holds therein data to be transmitted.

Figures 6A, 6B:
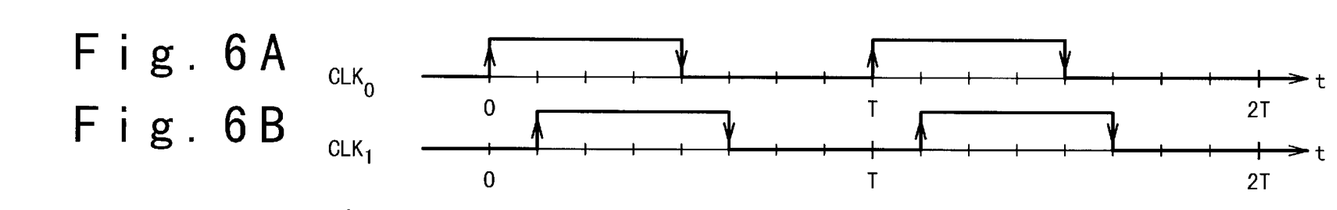
FIGS. 6A to 6E are views showing a manner in which an input signal is sampled and quantized on the basis of a clock signal.
Figure 6C:
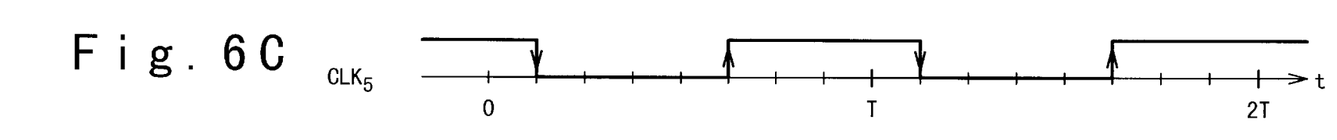
Figure 6D:
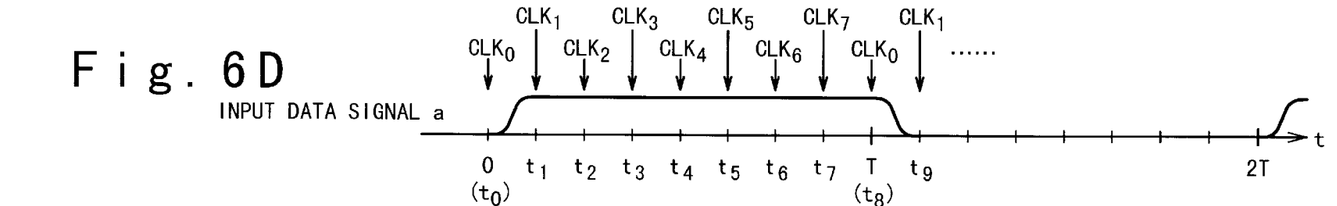
Figure 6E:
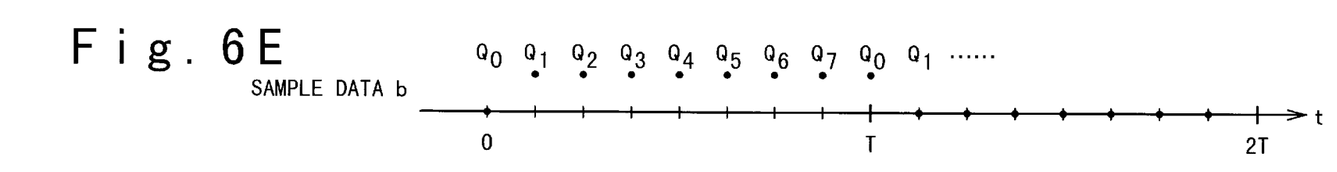

As shown in FIGS. 6A to 6C, the n clock signals $CLK_0$, $CLK_1$ to $CLK_{n-1}$ has a same period of T.

However, phases thereof are different from each other. Actually, the clock signal $CLK_i$ (i is the integer from 0 to n−1) is a signal which is out of phase by $2\pi i/n$ with respect to the clock signal $CLK_0$. The sample circuit 1 samples the input signal a, each time the n clock signals $CLK_0$ to $CLK_{n-1}$ are risen, and then quantizes the input signal a to two values of 1 and 0. The data values sampled by the clock signals $CLK_0$ to $CLK_{n-1}$ are represented by $Q_0$ to $Q_{n-1}$, respectively. A sample data signal b is constituted by the data values $Q_0$ to $Q_{n-1}$. The sample circuit 1 outputs the sample data signal b to the detector 2, and also the selector 5.

Figure 7A:
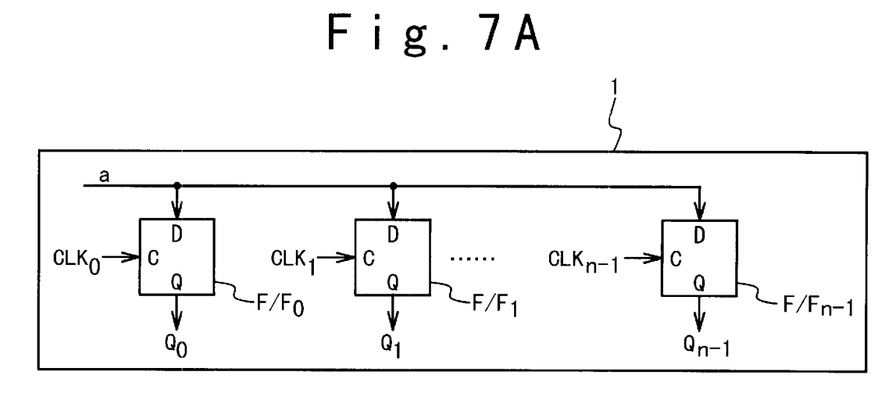
FIG. 7A is a view showing a configuration of a sample circuit.

FIG. 7A shows the configuration of the sample circuit 1. The sample circuit 1 has n D-flip-flops $F/F_0$ to $F/F_{n-1}$, in which the number n is equal to the number of the clock signals $CLK_0$ to $CLK_{n-1}$. The clock signals $CLK_0$ to $CLK_{n-1}$ are inputted to the D-flip-flops $F/F_0$ to $F/F_{n-1}$, respectively.

The D-flip-flop $F/F_i$ samples the input signal a at a time when each clock signal $CLK_i$ is risen, namely, at a time delayed by $i \times T/n$ from a time when the clock signal $CLK_i$ is risen. The D-flip-flop $F/F_i$ then holds therein it in a form that it is quantized to any of the two values of "1" and "0".

The data respectively held by the D-flip-flops $F/F_0$ to $F/F_{n-1}$ are the data values $Q_0$ to $Q_{n-1}$. The data values $Q_0$ to $Q_{n-1}$ respectively held by the D-flip-flops $F/F_0$ to $F/F_{n-1}$ are transmitted to the detector 2 by the sample data signal b.

The detector 2 has a falling edge detecting circuit 2-1 and a rising edge detecting circuit 2-2, as shown in FIG. 4. The falling edge detecting circuit 2-1 detects a falling edge timing when the input signal a is shifted from "1" to "0" referring to the sample data signal b.

The rising edge detecting circuit 2-2 detects a rising edge timing when the input signal a is shifted from "0" to "1".

The falling and rising edge timings are quantized to n states. That is, the falling and rising edge timings are represented by one of the numbers from 0 to n−1. If the input signal a shifts from "1" to "0" after the clock signal $CLK_{i-1}$ rises to "1" and before the clock signal $CLK_{i-1}$ rises to "1", the falling edge timing of the input signal a is represented by "i". Also, if the input signal a shifts from "0" to "1" after the clock signal $CLK_{i-1}$ rises to "1" and before the clock signal $CLK_{i-1}$ rises to "1", the rising edge timing of the input signal a is represented by "i".

Figure 8:
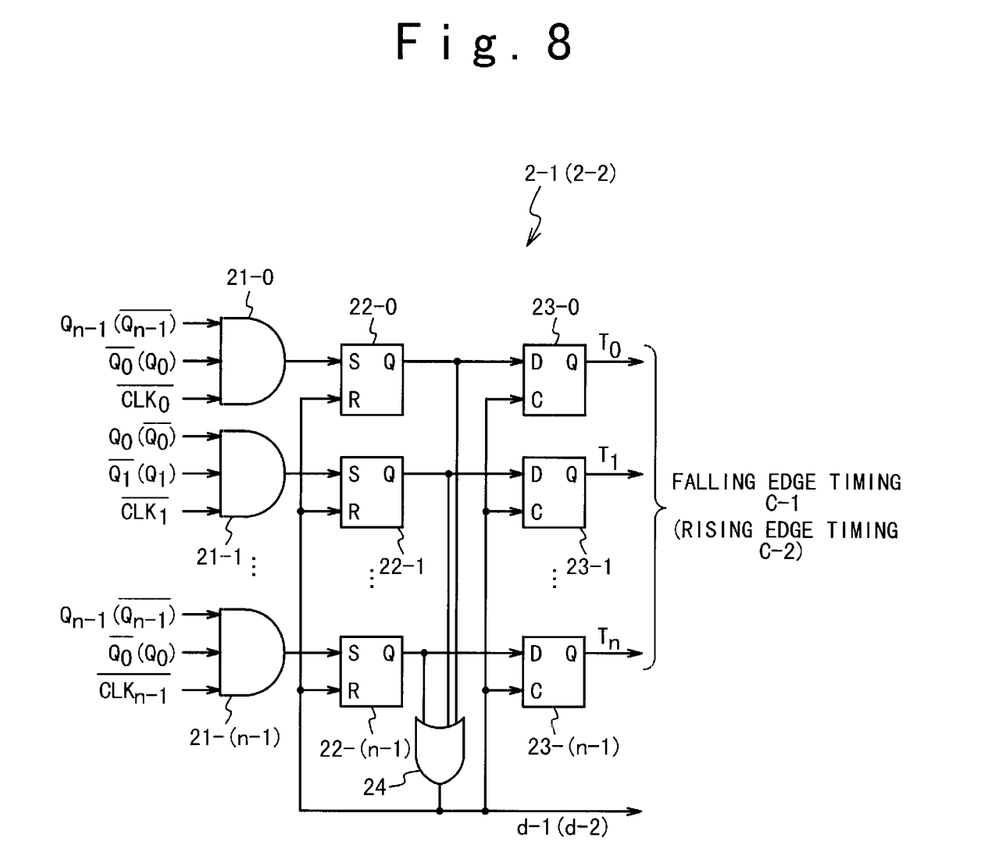
FIG. 8 is a view showing a configuration of a falling edge detecting circuit and a rising edge detecting circuit.

The falling edge detecting circuit 2-1 has the circuit configuration shown in FIG. 8. In the falling edge detecting circuit 2-1, the $Q_{n-1}$ and negative logics of the $Q_0$ and the $CLK_0$ are inputted to n AND gates 21-i (i is the integer from 0 to n−1) and an AND gate 21-0. Hereafter, negative logics of the $Q_{i-1}$ and the $Q_i$ and a negative logic of the $CLK_i$ are inputted to the AND gate 21-i. Outputs of the AND gates 21-0, 21-1 to 21-(n−1) are respectively inputted to set terminals of SR-flip-flops 22-0, 22-1 to 22-(n−1).

Outputs of the SR-flip-flops 22-i are inputted D-flip-flops 23-i, respectively. Also, all the outputs of the SR-flip-flops 22-i are inputted to an OR gate 24. An output of the OR gate 24 is inputted to reset terminals of all the SR-flip-flops 22-i and clock terminals of all the D-flip-flops 23-i. The output of the D-flip-flop 23-i becomes a detected falling edge position c-1.

Also, the output of the OR gate 24 becomes a falling edge detection pulse d-1 indicative of the detection of the falling edge position c-1.

The rising edge detecting circuit 2-2 has the circuit configuration similar to that of the falling edge detecting circuit 2-1. The Q, and the negative logics of the $Q_{n-1}$ and the $CLK$, are inputted to an AND gate 21-0. Similarly, the $Q_i$ and the negative logics of the $Q_{i-1}$, and the $CLK_i$ are inputted to an AND gate 21-i. The rising edge detecting circuit 2-2 generates a rising edge detection pulse d-2 indicative of a rising edge timing c-2 and a detection of the rising edge timing c-2.

The falling edge detecting circuit 2-1 and the rising edge detecting circuit 2-2 output the falling edge timing c-1 and the rising edge timing c-2, which are detected by the respective detectors, to a comparator 3, a memory 4 and the selector 5.

The detected falling edge timing c-1 and the detected rising edge timing c-2 may suffer from the influences of jitters and noises.

Therefore, the comparator 3 and the memory 4 calculate an adjusted falling edge timing f-1 and an adjusted rising edge timing f-2 which more reflect the input signal a, referring to the falling edge timing c-1 and the rising edge timing c-2. The adjusted falling edge timing f-1 and the adjusted rising edge timing f-2 also are represented by one of the number of 0 to n−1. The adjusted falling edge timing f-1 and the adjusted rising edge timing f-2 are stored in the memory 4.

The comparator 3 has a falling edge comparator 3-1 and a rising edge comparator 3-2. The falling edge comparator 3-1 receives the falling edge timing c-1 from the detector 2, and also receives the adjusted falling edge timing f-1 from the memory 4. The rising edge comparator 3-2 receives the rising edge timing c-2 from the detector 2 and also receives in the adjusted falling edge timing f-2 from the memory 4.

The falling edge comparator 3-1 compares the falling edge timing c-1 with the adjusted falling edge timing f-1. The falling edge comparator 3-1 outputs, to the memory 4, a falling edge adjustment pulse e-1 for carrying out an adjustment so that the adjusted falling edge timing f-1 gradually approaches the falling edge timing c-1, in accordance with the compared result.

The rising edge comparator 3-2 compares the rising edge timing c-2 with the adjusted rising edge timing f-2. The rising edge comparator 3-2 outputs, to the memory 4, a rising edge adjustment pulse e-2 for carrying out an adjustment so that the adjusted rising edge timing f-2 gradually approaches the rising edge timing c-2, in accordance with the compared result.

Figure 9:
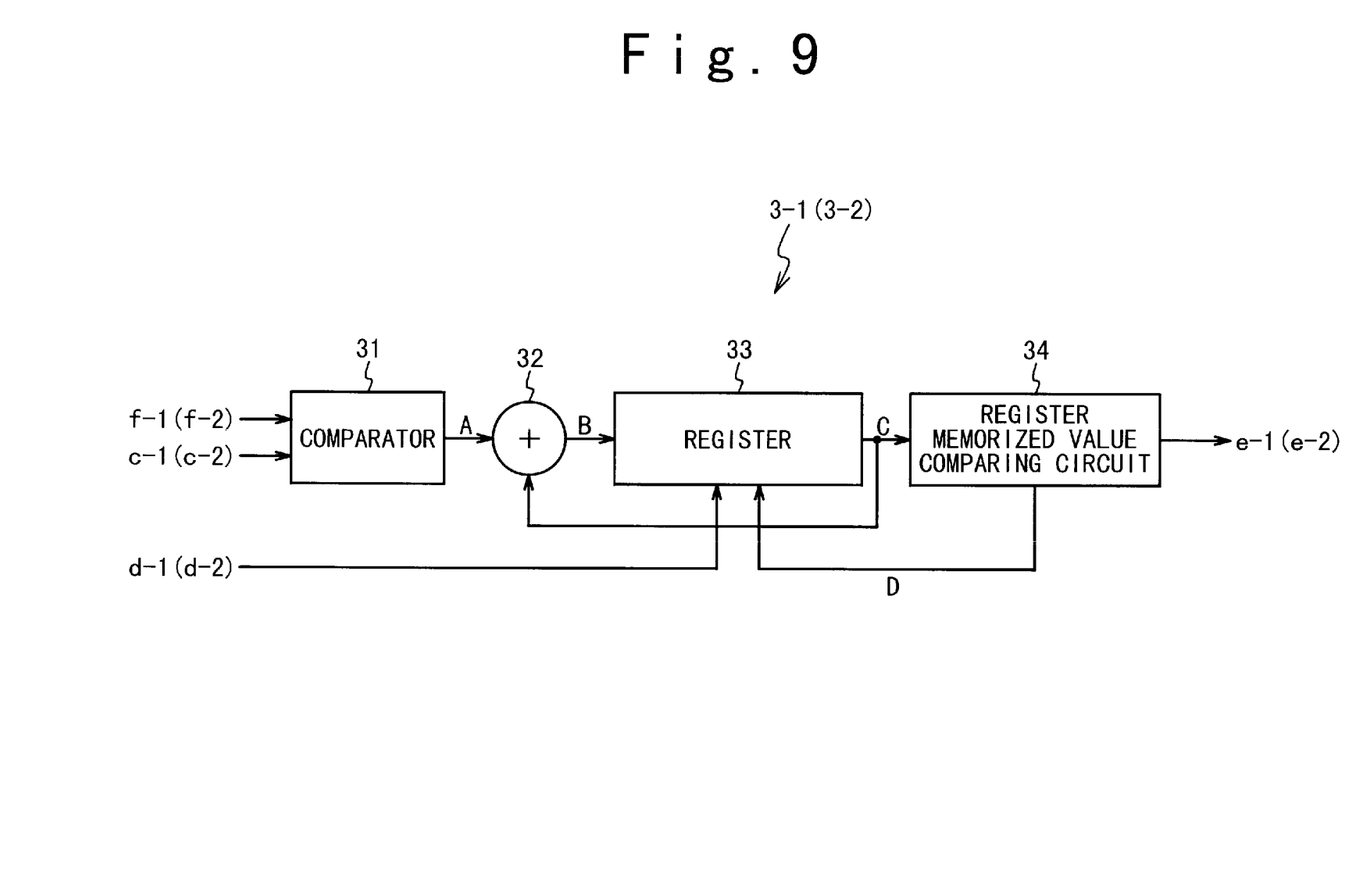
FIG. 9 is a view showing a configuration of a falling edge comparator and a rising edge comparator.

FIG. 9 shows the circuit configuration of the falling edge comparator 3-1. The falling edge comparator 3-1 has a comparator 31, an adder 32, a register 33 and a register value comparator 34. The register 33 holds therein a count value C. The count value C holds therein the information with regard to the previously detected comparison result between the falling edge timing c-1 and the adjusted falling edge timing f-1.

The falling edge timing c-1 and the adjusted falling edge timing f-1 are inputted to the comparator 31. The comparator 31 compares the falling edge timing c-1 with the adjusted falling edge timing f-1.

The comparator 31 outputs a comparison output value A based on the comparison result. Actually, if the number of the adjusted falling edge timing f-1 is smaller than the number of the falling edge timing c-1, the comparator 31 outputs +1 as the comparison output value A. If the number of the adjusted falling edge timing f-1 is equal to the number of the falling edge timing c-1, the comparator 31 outputs 0 as the comparison output value A. If the number of the adjusted falling edge timing f-1 is greater than the number of the falling edge timing c-1, the comparator 31 outputs −1 as the comparison output value A.

The adder 32 adds the comparison output value A and the count value C held by the register 33, and outputs an added value B to the register 33. The register 33 captures the added value B from the adder 32, synchronously with a pulse detection pulse d-1 from the falling edge timing detector 3-1, and defines it as the count value C. The register 33 outputs the held value to the adder 32 and the register value comparator 34.

The register value comparator 34 outputs a falling edge adjustment pulse e-1 if the count value C outputted by the register 33 reaches a predetermined upper limit. The falling edge adjustment pulse e-1 instructs the memory 4 to increase the memorized number indicating the adjusted falling edge timing f-1.

Also, if the count value C reaches a predetermined lower limit, the register value comparator 34 outputs the falling edge adjustment pulse e-1 instructing the memory 4 to decrease the adjusted falling edge timing f-1. The register value comparator 34 resets the register 33 through a reset signal D, after the count value C reaches the predetermined upper value or lower value. In this way, the adjusted falling edge timing f-1 is increased or decreased.

The rising edge comparator 3-2 has the same circuit configuration as the falling edge comparator 3-1. The rising edge timing c-2 and the adjusted rising edge timing f-2 are inputted.

A rising adjustment pulse e-2 is outputted instead of the falling edge adjustment pulse e-1, as the output. The rising edge comparator 3-2 holds therein the information with regard to the previously detected comparison result between the rising edge timing c-2 and the adjusted rising edge timing f-2, as the count value C. While referring to the count value C, it outputs the rising adjustment pulse e-2 for instructing the adjustment of the adjusted rising edge timing f-1.

The adjusted falling edge timing f-1 and the adjusted rising edge timing f-2 are adjusted only after the count value C reaches a certain value. Thus, it is possible to remove the influence caused by the jitter or the noise included in the input signal a. The falling edge adjustment pulse e-1 and the rising edge adjustment pulse e-2 are outputted to the memory 4.

The memory 4 has a falling edge timing memory 4-1 and a rising edge timing memory 4-2. The falling edge timing memory 4-1 and the rising edge timing memory 4-2 are ring counters for holding therein the values from 0 to n−1.

The falling edge timing memory 4-1 stores therein the adjusted falling edge timing f-1. Also, the falling edge timing memory 4-1 reads the falling edge timing c-1 from the falling edge detecting circuit 2-1 just after the start of the input of the input signal a, and uses it as an initial value of the adjusted falling edge timing f-1. The falling edge timing memory 4-1 sets the adjusted falling edge timing f-1 at a value, in which the input signal a is reflected the most suitably, in accordance with the falling edge adjustment pulse e-1.

The rising edge timing memory 4-2 stores therein the adjusted rising edge timing f-2. Also, it reads the rising edge timing c-2 from the rising edge detecting circuit 2-2 just after the start of the input of the input signal a, and uses it as an initial value of the adjusted rising edge timing f-2. The rising edge timing memory 4-2 sets the adjusted rising edge timing f-2 at a value, in which the input signal a is reflected the most suitably, in accordance with the rising edge adjustment pulse e-2. The falling edge timing memory 4-1 and the rising edge timing memory 4-2 transmit the adjusted falling edge timing f-1 and the adjusted rising edge timing f-2 to the selector 5, respectively.

The selector 5 has a clock determination circuit 5-1, an initial clock determination circuit 5-2, a selector 5-3 and an outputting circuit 5-4.

The clock determination circuit 5-1 selects a clock signal from among n clock signals $CLK_i$ in accordance with the adjusted falling edge timing f-1 and the adjusted rising edge timing f-2. The selected clock signal is selected such that the rising edge of the selected clock signal is most close to the middle of the adjusted falling edge timing f-1 and the adjusted rising edge timing f-2. A first selection number g-1 indicating the 5: selected clock signal is outputted to the selector 5-3.

The initial clock determination circuit 5-2 selects another clock signal from the n clock signals $CLK_i$, in accordance with the rising edge timing c-1 and the falling edge timing c-2. The selected clock signal is selected such that the rising edge of the selected clock signal is most close to the middle of the falling edge timing c-1 and the rising edge timing c-2. A second selection number g-2 indicating the selected clock signal is outputted to the selector 5-3.

The role of the initial clock determination circuit 5-2 is as follows. The adjusted falling edge timing f-1 and the adjusted rising edge timing f-2 are determined by referring to the previous rising edge timing c-1 and the previous falling edge timing c-2. However, immediately after the start of the input of the input signal a, there is no accumulated information with regard to the rising edge timing c-1 and the falling edge timing c-2 to be referred to. The initial clock determination circuit 5-2 is the circuit for selecting the other clock signal from the n clock signals $CLK_i$, without referring to the previous information in the comparator 3 and the memory 4.

The selector 5-3 selects any one of the first selection number g-1 and the second selection number g-2, and outputs a selection signal h indicating the selected one to the outputting circuit 5-4. 10. The outputting circuit 5-4 outputs, as a selected clock signal k, one clock signal selected from the n clock signals $CLK_i$, in accordance with the selection signal h. In addition, the outputting circuit 5-4 outputs a reproduced signal 1 based on the sample data signal b. The reproduced signal 1 corresponds to a signal produced by sampling the input signal a with the selected clock signal k.

An example of a manner for selecting the selected clock signal k is actually described with reference to timing charts shown in FIGS. 6A to 6E. Here, let us suppose that the initial values of all the D-flip-flops $F/F_i$ are 0. The input of the input signal a is started at t=0. Also, n=8.

The input signal a is sampled when the pulses of the n clock signals $CLK_i$ (i is the integer from 0 to n−1) are risen. The input signal a, which is respectively sampled with the clock signals $CLK_0$ to $CLK_{n-1}$, is quantized to "1" or "0" The held data $Q_0$ to $Q_{n-1}$, representing the results of the sampling and quantizing the input signal a are outputted with the sample data signal b to the falling edge detecting circuit 2-1 and the rising edge detecting circuit 2-2.

The falling edge detecting circuit 2-1 detects the falling edge timing c-1 in the form of an integer number selected from among 0 to n−1. Actually, if a value of $F/F_{j-1}$ is 1 and a value of $F/F_j$ is 0, it is recognized that the pulse is trailed, and it is detected that the rising edge timing c-1 is a number j. (Here, in a case of j=0, it should be considered that (j−1) is replaced by (n−1)).

The rising edge detecting circuit 2-2 detects the rising edge timing in the form of an integer number selected from among 0 to n−1. The sample data signal b is used in detecting it.

Actually, if the value of F/Fj−1 is 0 and the value of F/Fj is 1, it is recognized that the pulse is risen, and it is detected that the falling edge timing is the number j. (However, in the case of j=0, it should be considered that (j−1) is replaced by (n−1)).

In the cases shown in FIGS. 6A to 6E, the sample data signal b is shifted from 1 to 0 at a time $t_9$. That is, at the time t-9, a "1" is held in the $F/F_0$, and a "0" is held in the $F/F_1$. It is detected that the falling edge timing c-1 is 1. Also, the sample data signal b is shifted from "0" to "1" at a time $t_1$. That is, at the time to, a "0" is held in the $F/F_0$, and a "1" is held in the $F/F_1$. It is detected that the rising edge timing c-2 is 1. The detected falling edge c-1 and the detected rising edge timing c-2 are transmitted to the comparator 3, the memory 4 and the selector 5.

One clock signal is selected from the clock signals $CLK_i$ by the comparator 3, the memory 4 and the selector 5. The selected clock signal is outputted as the selected clock signal k by the outputting circuit 5-4.

The selected clock signal k is selected in any one of two methods. In the first method, the selected clock signal k is directly determined from the detected falling edge timing c-1 and the detected rising edge timing c-2. Thus, in the first method, the selected clock signal k can be selected in a short time equal to about the period of the input signal a.

The second method determines the selected clock signal k based on the adjusted falling edge timing f-1 and the adjusted rising edge timing f-2. The adjusted falling edge timing f-1 and the adjusted rising edge timing f-2 are determined by referring to the falling edge timing c-1 and the rising edge timing c-2. Thus, the second method selects the selected clock signal k while reducing the influence of the jitter and the noise.

The first method is used immediately after the start of the input of the input signal a. It switches to the second method after the decision of the adjusted falling edge timing f-1 and the adjusted rising edge timing f-2. By switching between the first and second methods and using the selected method, it is possible to select the selected clock signal k in a short time while reducing the influence of the jitter and the noise. The manner for selecting the selected clock signal k by using the first and second methods will be described below.

In the first method, the selected clock signal k is determined such that a rising edge of the selected clock signal k is closest to the middle between the falling edge timing c-1 and the rising edge timing c-2. The determination is done by the initial clock determination circuit 5-2.

Actually, it is determined as described below. If the number of the falling edge timing c-1 is greater than the number of the rising edge timing c-2, a clock signal having a number of an average of them is selected. For example, when the number of the falling edge timing c-1 is 6 and the number of the rising edge timing c-2 is 0, the clock signal $CLK_3$ is selected as the selected clock signal k.

When a fraction remains after the calculation of the average, the fraction is rounded down. For example, when the number of the falling edge timing c-1 is 7 and the number of the rising edge timing is 0, the clock signal $CLK_3$ is selected as the selected clock signal k. The fraction may be rounded up.

When the number of the falling edge timing c-1 is equal to or smaller than the number of the rising edge timing c-2, the number of the clock signal is determined to an average of the number in which n is added to the number of the falling edge timing c-1 and the number of the rising edge timing c-2.

Figure 7B:
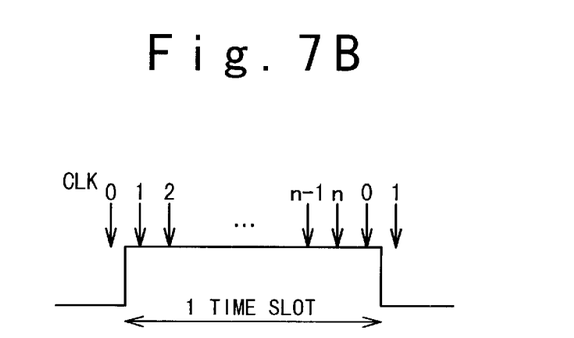
FIG. 7B is a view describing an operation of a sample circuit.

For example, as in the case in the timing chart shown in FIG. 7B, when the number of the falling edge timing c-1 and the number of the rising edge timing c-2 are both 1, and n=8. In this case, the clock signal $CLK_5$ is selected from ((1+8)+1)/2=5. If a fraction remains after the calculation of the average, the fraction is rounded down. The fraction may be rounded up. The initial clock determination circuit 5-2 outputs the number of the selected clock signal as the second selection number g-2 to the selector 5-3.

In the second method, the selected clock signal k is determined as described below. The falling edge timing c-1 and the rising edge timing c-2 are firstly detected after the start of the input of the input signal a. The falling edge timing c-1 and the rising edge timing c-2 firstly detected become the initial values of the adjusted falling edge timing f-1 and the adjusted rising edge timing f-2, respectively.

After that, the adjusted falling edge timing f-1 is adjusted in accordance with the falling edge timing c-1. The adjusted rising edge timing f-2 is adjusted in accordance with the rising edge timing c-2.

The adjusted falling edge timing f-1 and the adjusted rising edge timing f-2, which are respectively stored in the falling edge timing memory 4-1 and the rising edge timing memory 4-2, are outputted to the clock determination circuit 5-1. The clock determination circuit 5-1 determines the selected clock signal k so that a rising position of a pulse of the selected clock signal k is located at the closest position to a center between the falling edge timing and the rising edge timing.

The selected clock signal k is determined similarly to the case in which in the first method, the falling edge timing c-1 and the rising edge timing c-2 are replaced with the adjusted falling edge timing f-1 and the adjusted rising edge timing f-2, respectively. The clock determination circuit 5-1 outputs the number of the selected clock signal k as the first selection number g-1 to the selector 5-3.

The selector 5-3 selects any one of the first selection number g-1 determined by the clock determination circuit 5-1 and the second selection number g-2 determined by the initial clock determination circuit 5-2.

The selection in the selector 5-3 is done as described below. The second selection number g-2 determined by the initial clock determination circuit 5-2 is selected just after the start of the input of the input signal a. The first selection number g-1 determined by the clock determination circuit 5-1 is selected after the decision of the output from the clock determination circuit 5-1 after an elapse of a certain time. The selector 5-3 outputs the selected result as a selection signal h to the outputting circuit 5-4.

The outputting circuit 5-4 outputs, as the selected clock signal k, one clock signal among the clock signals $CLK_i$ in accordance with the selection signal h. In addition, the outputting circuit 5-4 outputs a reproduced signal l based on the sample data signal b. The reproduced signal l corresponds to a signal produced by sampling the input signal a with the selected clock signal k.

The clock signal producing circuit according to the first embodiment does not use an analog circuit in which an operation speed is slow. It selects the clock by using the digital circuit. Thus, the clock signal can be selected at a high speed.

Also, it determines the adjusted falling edge timing f-1 and the adjusted rising edge timing f-2, which properly reflect the input signal a, while going back to and referring to the previous falling edge timing c-1 and the previous rising edge timing c-2 in which the influence of the jitter or the noise is included. It selects the clock through the adjusted falling edge timing f-1 and the adjusted rising edge timing f-2. Such configuration can remove the influence of the short variation in selecting the clock. Thus, it is hard to receive the influence of the jitter or the noise.

Moreover, it switches between the method for selecting the clock directly from the falling edge timing c-1 and the rising edge timing c-2 and the method for selecting the clock through the adjusted falling edge timing f-1 and the adjusted rising edge timing f-2. Thus, it is possible to select the clock signal at a higher speed and also reduce the influence caused by the jitter or the noise.

In the first embodiment, the manner for referring to the previous falling edge timing c-1 or the previous rising edge timing c-2 is not limited to the case described in the first embodiment. For example, it is also possible to calculate the average of the falling edge timing c-1 or the rising edge timing c-2.

Also, it is possible to design the configuration without the initial clock determination circuit 5-2 and the selector 5-3. In this case, it does not switch between the method for selecting the clock directly from the falling edge timing c-1 and the rising edge timing c-2 and the method for selecting the clock through the adjusted falling edge timing f-1 and the adjusted rising edge timing f-2 which are stored in the memory 4.

Moreover, it is possible to design the configuration in which the falling edge timing and the rising edge timing are not outputted to the falling edge timing memory 4-1 and the rising edge timing memory 4-2. In this case, predetermined values are set for initial values of the falling edge timing memory 4-1 and the rising edge timing memory 4-2.

Moreover, it is possible to design the configuration without the comparator 3 and the memory 4. In this case, the clock is selected directly from the falling edge timing and the rising edge timing. This case receives the influence caused by the jitter or the noise. However, it is possible to select the clock at a high speed, and also possible to simplify the configuration of the apparatus.

Figure 10:
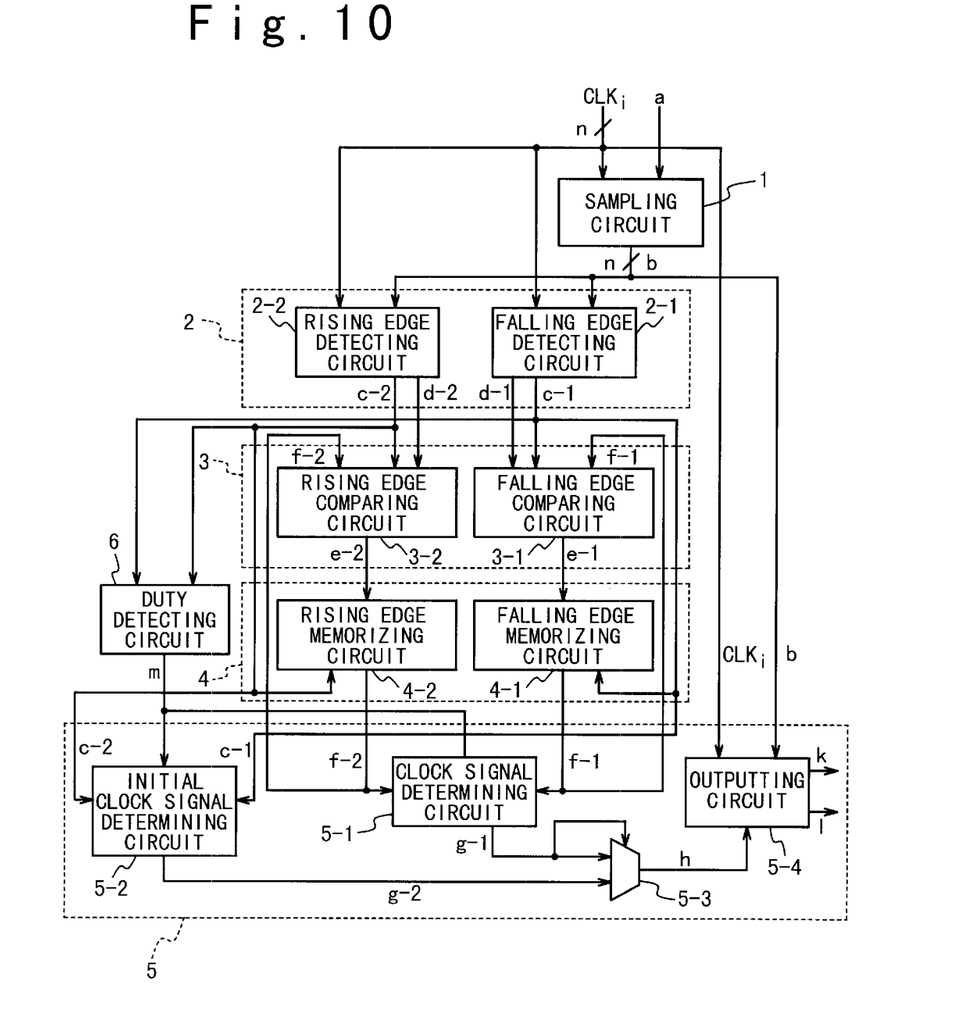
FIG. 10 is a view showing a configuration of a clock identification reproduction circuit according to a second embodiment of the present invention.

A clock signal producing circuit of a second embodiment according to the present invention will be described below. The configuration of the clock identification reproduction circuit of the second embodiment is substantially similar to that of the first embodiment, as shown in FIG. 10. The differences are as follows.

The first difference lies in a fact that the clock signal producing circuit according to the second embodiment further includes a duty ratio detector 6. The duty ratio detector 6 detects a duty ratio of the input signal a referring to the falling edge timing c-1 and the rising edge timing c-2.

The duty ratio detector 6 sends a fact as to whether or not the duty ratio is higher than 50%, through a duty ratio detection signal m, to the clock determination circuit 5-1 and the initial clock determination circuit 5-2.

The second difference lies in a fact that the duty ratio detection signal m is inputted to the clock determination circuit 5-1 and the initial clock determination circuit 5-2, and one of the clock signals $CLK_i$ is determined as the selected clock signal k, in accordance with the duty ratio detection signal m.

The operations of the clock identification reproduction circuit of the second embodiment will be described below. The input of the input signal a is started at t=0. Also, n=8. Let us consider the respective cases in which the input signals a have waveforms illustrated in timing charts, as shown in FIGS. 11A to 11B.

The sample circuit 1 samples and quantizes the input signal a, and outputs as the sample data signal b. The falling edge timing c-1 and the rising edge timing c-2 are detected in accordance with the sample data signal b. The operations until this time are similar those of the first embodiment.

Figure 11A:
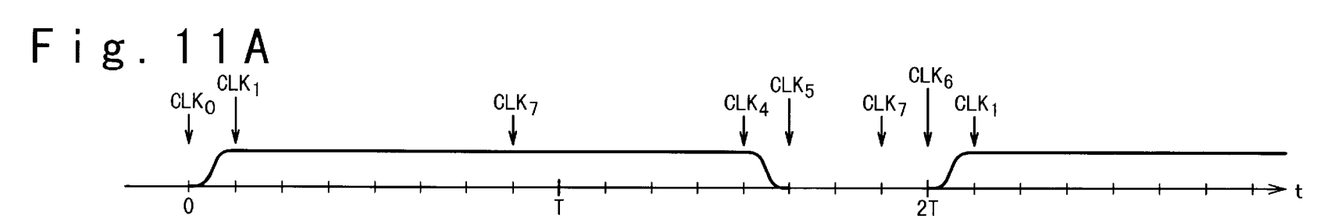
FIGS. 11A to 11D are views showing an example of an input signal inputted to the clock identification reproduction according to the second embodiment of the present invention.
Figure 11B:
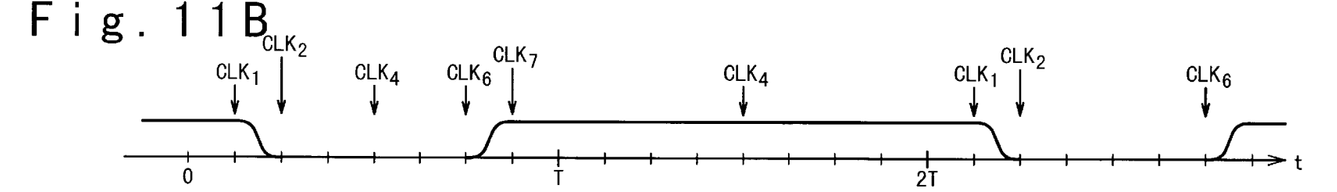

As for the input signals a illustrated in the timing charts in FIGS. 11A and 11B, the falling edge timing c-1 is detected as 5, and the rising edge timing c-2 is detected as 1. As for the input signals a illustrated in the timing charts in FIGS. 11C and 11D, the falling edge timing c-1 is detected as 7, and the rising edge timing c-2 is detected as 2.

After that, the duty ratio detector 6 detects the duty ratio from the falling edge timing c-1 and the rising edge timing c-2.

As for the input signals a illustrated in the timing charts in FIGS. 11A and 11B, it is judged that the duty ratio is higher than 50%. As for the input signals a illustrated in the timing charts in FIGS. 11C and 11D, it is judged that the duty ratio is smaller than 50%. The judgment with regard to the duty ratio is transmitted to the clock determination circuit 5-1 and the initial clock determination circuit 5-2, through the duty ratio detection signal m.

One clock signal is selected from among the clock signals $CLK_i$ with reference to the duty ratio detection signal m. At the time of the selection, the two methods are jointly used similarly to the first embodiment. In the first method, the selected clock signal k is determined directly from the detected falling edge timing c-1 and the detected rising edge timing c-2. In the second method, the selected clock signal k is determined through the adjusted falling edge timing f-1 and the adjusted rising edge timing f-2. Similarly to the first embodiment, the first method is used just after the start of the input of the input signal a. After that, it switches to the second method after the decision of the adjusted falling edge timing f-1 and the adjusted rising edge timing f-2.

In the first method, the initial clock determination circuit 5-2 determines the selected clock signal k, as described below. With reference to the duty ratio detection signal m, one clock signal is selected from the clock signals $CLK_i$ in accordance with the falling edge timing c-1 and the rising edge timing c-2.

If it is judged that the duty ratio is higher than 50% (in the cases of FIGS. 11A and 11B), the clock is selected such that it is sampled at the middle in a period while a data value is "0". Actually, the clock is selected as described below.

When the number of the falling edge timing c-1 is greater than the number of the rising edge timing c-2 (FIG. 11A), a number of an average of the number of the falling edge timing c-1 and the number in which n is added to the number of the rising edge timing c-2 is defined as a number of the selected clock signal k. In FIG. 11A, the number of the falling edge timing c-1 is 5, and the number of the rising edge timing c-2 is 1.

Thus, the selection clock signal CLK7 is selected from (1+8+5)/2=7.

If the number of the falling edge timing c-1 is equal to or smaller than the number of the rising edge timing c-2 (FIG. 11B), a number of an average of the number of the falling edge timing c-1 and the number of the rising edge timing c-2 is defined as a number of the selection clock signal.

In FIG. 11B, the number of the falling edge timing c-1 is 2, and the number of the rising edge timing c-2 is 7. Thus, the selection clock signal CLK4 is selected from (7+2)/2=4. A fraction is rounded down. The fraction may be rounded up.

If it is judged that the duty ratio is equal to or lower than 50% (FIGS. 11C and 11D), the clock is selected such that it is sampled at a middle point in a period while the data value is "1". Actually, the clock is selected as described below. When the number of the falling edge timing c-1 is greater than the number of the rising edge timing c-2 (FIG. 11C), a number of an average of the number of the falling edge timing c-1 and the number of the rising edge timing c-2 is defined as a number of the selected clock signal k. In FIG. 11, the number of the falling edge timing c-1 is 5, and the number of the rising edge timing c-2 is 1. Thus, the selection clock signal CLK3 is selected from (1+5)/2=3.

If the number of the falling edge timing c-1 is equal to or smaller than the number of the rising edge timing c-2 (FIG. 11D), a number of an average of a number in which n is added to the number of the falling edge timing c-1 and the number of the rising edge timing c-2 is defined as a number of the selected clock signal k.

Figure 11C:
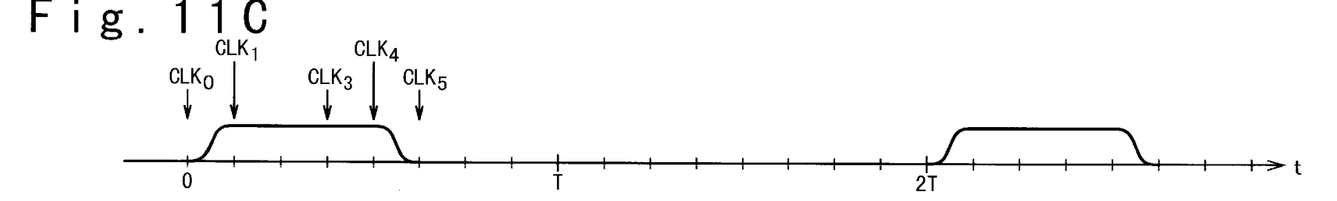
Figure 11D:
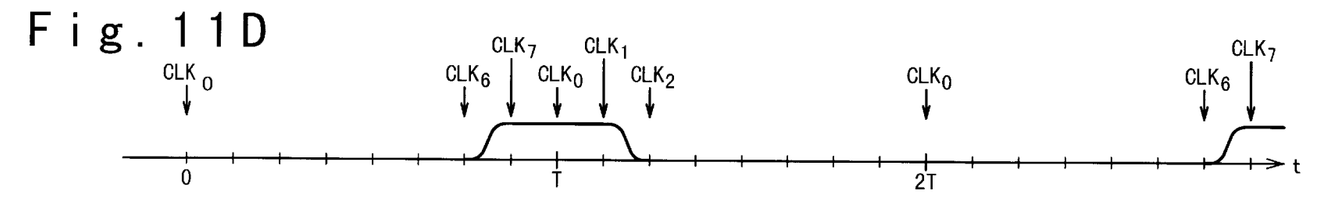

In FIG. 11D, the number of the rising edge timing is 7, and the number of the falling edge timing is 2. Thus, the selection clock signal CLK0 is selected from (7+2+8)/2=8.5 (if the number of the clock signal exceeds 8, 8 is subtracted from it. The number of the selected clock signal is outputted as the second selection number g-2 to the selector 5-3.

In the second method, the selected clock signal k is determined as described below. The setting and the adjustment between the adjusted falling edge timing f-1 and the adjusted rising edge timing f-2 are done with reference to the falling edge timing c-1 and the rising edge timing c-2 previously detected. The setting and the adjustment are done similarly to those of the first embodiment.

One clock signal is selected from the clock signals $CLK_i$ in accordance with the adjusted falling edge timing f-1 and the adjusted rising edge timing f-2. The selection is done with reference to the duty ratio detection signal m.

When the clock determination circuit 5-1 determines a selection clock signal e, it is done similarly to the first method by using the adjusted falling edge timing f-1 and the adjusted rising edge timing f-2, instead of the falling edge timing c-1 and the rising edge timing c-2.

The selector 5-3 selects any of the first selection number g-1 and the second selection number g-2. The second selection number g-2 is selected just after the start of the input of the input signal a. The first selection number g-1 is selected after the decision of the adjusted falling edge timing f-1 and the adjusted rising edge timing f-2. The selection signal h is outputted to the outputting circuit 5-4 in accordance with the selected result.

The outputting circuit 5-4 outputs, as the selected clock signal k, one clock signal among the clock signals $CLK_i$ in accordance with the selection signal h. At the same time, it selects a data quantized by sampling the input signal a based on the selected clock signal k, from the sample data signal b, and outputs as a selection data signal l.

The clock identification reproduction circuit of the second embodiment can select the clock signal at the high speed and reduce the influence caused by the jitter or the noise, similarly to the clock identification reproduction circuit of the first embodiment. In addition, it can select the clock signal suitable for the duty ratio of the input signal.

In the two input signals shown in FIGS. 11A and 11B, although the wave forms of the input signals are different from each other, it is detected that the falling edge timing c-1 and the rising edge timing c-2 (or the adjusted falling edge timing f-1 and the adjusted rising edge timing f-2) are equal to each other.

Similarly, in the two input signals shown in FIGS. 11C and 11D, it is detected that the falling edge timing c-1 and the rising edge timing c-2 (or the adjusted falling edge timing f-1 and the adjusted rising edge timing f-2) are equal to each other. However, even in those cases, the clock signal producing circuit of the second embodiment can select the proper clock signal.

In the second embodiment, it is possible to design the configuration without the initial clock determination circuit 5-2 and the selector 5-3. In this case, it does not switch between the Method for selecting the clock directly from the falling edge timing c-1 and the rising edge timing c-2 and the method for selecting the clock through the adjusted falling edge timing f-1 and the adjusted rising edge timing f-2.

Moreover, it is possible to design the configuration in which the falling edge timing c-1 and the rising edge timing c-2 are not outputted to the falling edge timing memory 4-1 and the rising edge timing memory 4-2. In this case, predetermined values are set for the initial values of the falling edge timing memory 4-1 and the rising edge timing memory 4-2.

Moreover, it is possible to design the configuration without the comparator 3 and the memory 4. In this case, the clock is selected directly from the falling edge timing c-1 and the rising edge timing c-2. This case receives the influence caused by the jitter or the noise. However, it is possible to simplify the configuration of the apparatus.

The clock producing circuit according to the present invention can establish the synchronization in a short time after the input of the input signal. Also, the synchronization can be surely established within a certain number of bits after the input of the input signal. Moreover, even if the data signal having the jitter and the noise is inputted, it is possible to reduce the influence caused by the jitter or the noise and thereby to produce the proper clock signal. In addition, a production of a proper clock signal can be achieved correspondingly to the duty ratio of the pulse of the input signal. Also, a production of a proper clock signal can be achieved without using a clock signal having high frequency.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A clock signal producing apparatus comprising:
    a detecting circuit detecting edge timings of an input signal at which said input signal is inverted, wherein said edge timings are quantized to a predetermined number of states;
    a clock signal outputting circuit outputting an outputted clock signal, wherein a phase of said outputted clock signal is established based on said edge timings;
    a memorizing circuit coupled to said detecting circuit and said clock signal outputting circuit; and
    a comparator coupled to said memorizing circuit;
    wherein said edge timing have a present edge timing which is the latest of said edge timings, and a past adjusted edge timing which is detected before said present edge timing is detected, and wherein said comparator compares said present edge timing with said past adjusted edge timing, and wherein said memorizing circuit memorizes said past edge timing, and said phase of said outputted clock signal is selected based on said present edge timing and said past edge timing.

2. A clock signal producing apparatus according to claim 1, wherein said phase is established based on said present edge timing during a first period, and said phase is established based on said present edge timing and said past edge adjusted timing during a second period following said first period.

3. A clock signal producing apparatus comprising:
    a detecting circuit detecting edge timings of an input signal at which said input signal is inverted, wherein said edge timings are quantized to a predetermined number of states; and
    a clock signal outputting circuit outputting an outputted clock signal, wherein a phase of said outputted clock signal is established based on said edge timings;
    wherein said clock signal outputting circuit selects, from among a plurality of clock signals whose phases are different from each other, said outputted clock signal based on a selection signal representative of a present edge timing which is the latest of said edge timings, and a past adjusted edge timing which is detected before said present edge timing is detected.

4. A clock signal producing apparatus comprising:
- a detecting circuit detecting edge timings of an input signal at which said input signal is inverted, wherein said edge timings are quantized to a predetermined number of states;
- a clock signal outputting circuit outputting an outputted clock signal, wherein a phase of said outputted clock signal is established based on said edge timings;
- wherein said edge timings have a rising edge timing at which said input signal rises from a low level to a high level, and a falling edge timing at which said input signal falls from said high level to said low level; and
- wherein said phase of said outputted clock signal is established based on said rising edge timing and said falling edge timing.

5. A clock signal producing apparatus according to claim 4 wherein said phase is established such that another rising edge timing of said outputted clock signal is located in substantially a middle between said rising edge timing and said falling edge timing of the input signal.

6. A clock signal producing apparatus according to claim 4, wherein said clock signal outputting circuit selects said outputted clock signal based on a selection signal representative of said rising edge timing and said falling edge timing from among a plurality of clock signals whose phases are different from each other.

7. A clock signal producing apparatus comprising:
- a detecting circuit detecting edge timings of an input signal at which an input signal is inverted, wherein said edge timings are quantized to a predetermined number of states;
- wherein said edge timings have a rising edge timing at which said input signal rises from a low level to a high level, and a falling edge timing at which said input signal falls from said high level to said low level;
- a clock signal outputting circuit outputting an outputted clock signal, wherein a phase of said outputted clock signal is established based on said edge timings; and
- a duty detecting circuit detecting a duty ratio of said input signal based on said rising and falling edge timings, wherein said phase is established based on said duty ratio.

8. A clock signal producing apparatus comprising:
- a detecting circuit detecting edge timings of an input signal at which said input signal is inverted, wherein said edge timings are quantized to a predetermined number of states; and
- a clock signal outputting circuit outputting an outputted clock signal, wherein a phase of said outputted clock signal is established based on said edge timings;
- wherein said clock signal outputting circuit further outputs selection data derived from sampling based on said outputted clock signal and said input signal in synchronization with the output of said outputted clock signal.

9. A method of producing a clock signal comprising:
- inputting an input signal;
- detecting edge timings of said input signal at which said input signal is inverted, wherein said edge timings are quantized to a predetermined number of states; and
- outputting an outputted clock signal, wherein a phase of said outputted clock signal is established based on said edge timings;
- wherein said edge timings have a present edge timing which is the latest of said edge timings, and a past edge adjusted timing which is detected before said present edge timing is detected, and wherein said phase of said outputted clock signal is established based on said present edge timing and said past edge adjusted timing.

10. A method of producing a clock signal according to claim 9, wherein said phase is established based on said present edge timing during a first period, and said phase is established based on said present edge timing and said past edge adjusted timing during a second period following said first period.

11. A method of producing a clock signal according to claim 9, wherein said outputting step includes selecting, from among a plurality of clock signals whose phases are different from each other, said outputted clock signal, based on said present edge timing and said past edge adjusted timing.

12. A method of producing a clock signal comprising:
- inputting an input signal;
- detecting edge timings of said input signal at which said input signal is inverted, wherein said edge timings are quantized to a predetermined number of states; and
- outputting an outputted clock signal, wherein a phase of said outputted clock signal is established based on said edge timings;
- wherein said edge timings have a rising edge timing at which said input signal rises from a low level to a high level, and a falling edge timing at which said input signal falls from said high level to said low level: and
- wherein said phase of said outputted clock signal is established based on said rising edge timing and said falling edge timing.

13. A method of producing a clock signal according to claim 12, wherein said phase is established such that another rising edge timing of said outputted clock signal is located in substantially a middle between said rising edge timing and said falling edge timing of the input signal.

14. A method of producing a clock signal according to claim 12, said outputting step includes selecting, from among a plurality of clock signals whose phases are different from each other, said outputted clock signal based on said rising edge timing and said falling edge timing.

15. A method of producing a clock signal comprising:
- inputting an input signal;
- detecting edge timings of said input signal at which said input signal is inverted, wherein said edge timings are quantized to a predetermined number of states;
- wherein said edge timings have a rising edge timing at which said input signal rises from a low level to a high level, and a falling edge timing at which said input signal falls from said high level to said low level;
- outputting an outputted clock signal, wherein a phase of said outputted clock signal is established based on said edge timings; and
- detecting a duty ratio of said input signal based on said rising and falling edge timings, wherein said phase is established based on said duty ratio.

16. A method of producing a clock signal comprising:
- inputting an input signal;
- detecting edge timings of said input signal at which said input signal is inverted, wherein said edge timings are quantized to a predetermined number of states;
- outputting an outputted clock signal, wherein a phase of said outputted clock signal is established based on said edge timings; and
- outputting a selection data signal derived from sampling said input signal based on said outputted clock signal and in synchronization with the output of said outputted clock signal.

* * * * *

UNITED STATES PATENT AND TRADEMARK OFFICE
CERTIFICATE OF CORRECTION

PATENT NO.     : 6,577,167 B1
DATED          : June 10, 2003
INVENTOR(S)    : Soda It is certified that error appears in the above-identified patent and that said Letters Patent is hereby corrected as shown below:

Column 14,
Line 58, "outpuffing" should be -- outputting --.

Signed and Sealed this

Twenty-eighth Day of October, 2003

JAMES E. ROGAN
*Director of the United States Patent and Trademark Office*